(12) United States Patent
Li et al.

(10) Patent No.: US 11,581,513 B2
(45) Date of Patent: Feb. 14, 2023

(54) DISPLAY SUBSTRATE AND METHOD FOR MANUFACTURING THE SAME, AND DISPLAY DEVICE

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Wenbo Li, Beijing (CN); Xueyan Tian, Beijing (CN)

(73) Assignees: Beijing BOE Technology Development Co., Ltd., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 163 days.

(21) Appl. No.: 16/941,361

(22) Filed: Jul. 28, 2020

(65) Prior Publication Data

US 2021/0066666 A1 Mar. 4, 2021

(30) Foreign Application Priority Data

Aug. 30, 2019 (CN) .......................... 201910817677.7

(51) Int. Cl.
- *H01L 51/52* (2006.01)
- *H01L 27/32* (2006.01)
- *H01L 51/56* (2006.01)

(52) U.S. Cl.
CPC ...... *H01L 51/5271* (2013.01); *H01L 27/3246* (2013.01); *H01L 51/56* (2013.01); *H01L 2227/323* (2013.01); *H01L 2251/5315* (2013.01)

(58) Field of Classification Search
CPC ............. H01L 51/5271; H01L 27/3246; H01L 27/326; H01L 51/5281
See application file for complete search history.

(56) References Cited

U.S. PATENT DOCUMENTS

| 9,245,936 B2 | 1/2016 | Choi et al. |
| 2004/0212294 A1 | 10/2004 | Oda et al. |

(Continued)

FOREIGN PATENT DOCUMENTS

| CN | 102437172 A | 5/2012 |
| CN | 103268921 A | 8/2013 |

(Continued)

OTHER PUBLICATIONS

State Intellectual Property Office of the People's Republic of China, Office Action and Search Report Issued in Application No. 201910817677.7, dated Jun. 1, 2021, 18 pages. (Submitted with Partial Translation).

(Continued)

*Primary Examiner* — Fernando L Toledo
*Assistant Examiner* — Valerie N Newton
(74) *Attorney, Agent, or Firm* — McCoy Russell LLP

(57) ABSTRACT

The present disclosure provides a display substrate, a method for manufacturing the same, and a display device. The display substrate includes: a base substrate; a plurality of light emitting units on the base substrate, where the plurality of light emitting units include a plurality of pixel display areas; and a reflection layer on the base substrate. The reflection layer includes a plurality of patterns and a plurality of openings defined between adjacent patterns of the plurality of patterns, and positions of the plurality of openings are corresponding to positions of the plurality of pixel display areas.

13 Claims, 3 Drawing Sheets

(56) References Cited

U.S. PATENT DOCUMENTS

| | | |
|---|---|---|
| 2013/0049640 A1 | 2/2013 | Kuo et al. |
| 2014/0166996 A1 | 6/2014 | Kim |
| 2014/0299850 A1 | 10/2014 | Yim et al. |
| 2017/0104182 A1* | 4/2017 | Kim .................. H01L 27/322 |
| 2017/0112661 A1 | 4/2017 | Yang et al. |
| 2017/0194602 A1 | 7/2017 | Cui et al. |
| 2017/0221982 A1 | 8/2017 | Park |
| 2017/0244069 A1 | 8/2017 | Kim et al. |
| 2018/0212179 A1 | 7/2018 | Yu |
| 2021/0181886 A1 | 6/2021 | Hua et al. |

FOREIGN PATENT DOCUMENTS

| | | |
|---|---|---|
| CN | 103531607 A | 1/2014 |
| CN | 103872072 A | 6/2014 |
| CN | 104103661 A | 10/2014 |
| CN | 104887384 A | 9/2015 |
| CN | 104979375 A | 10/2015 |
| CN | 106571381 A | 4/2017 |
| CN | 106654047 A | 5/2017 |
| CN | 107026245 A | 8/2017 |
| CN | 107104126 A | 8/2017 |
| CN | 109387964 A | 2/2019 |
| CN | 109786578 A | 5/2019 |

OTHER PUBLICATIONS

State Intellectual Property Office of the People's Republic of China, Office Action and Search Report Issued in Application No. 201910817677.7, dated Jan. 21, 2022, 13 pages. (Submitted with Partial Translation).

\* cited by examiner

DISPLAY SUBSTRATE AND METHOD FOR MANUFACTURING THE SAME, AND DISPLAY DEVICE

CROSS-REFERENCE TO RELATED APPLICATION

This application claims priority to Chinese Application No. 201910817677.7, filed on Aug. 30, 2019. The entire contents of the above-listed application is hereby incorporated by reference for all purposes.

TECHNICAL FIELD

The present disclosure relates to the field of display technologies, and in particular to a display substrate, a method for manufacturing the same, and a display device.

BACKGROUND

A mirror display device refers to a display device that has both display and reflection functions, such as a car rearview mirror and a cosmetic mirror. Taking the car rearview mirror as an example, the car rearview mirror uses its reflection function as a mirror to observe the scene behind the vehicle, and can also be used as a display device to display some video images. However, the display effect of the mirror display device in the related art is poor.

SUMMARY

One embodiment of the present disclosure provides a display substrate, including: a base substrate; a plurality of light emitting units on the base substrate, where the plurality of light emitting units include a plurality of pixel display areas; and a reflection layer on the base substrate. The reflection layer includes a plurality of patterns and a plurality of openings defined between adjacent patterns of the plurality of patterns, and positions of the plurality of openings are corresponding to positions of the plurality of pixel display areas.

Optionally, the display substrate further includes: a pixel definition layer on the base substrate; the pixel definition layer include a plurality of patterns; orthographic projections of the plurality of patterns of the pixel definition layer to the base substrate coincide with the orthographic projections of the plurality of patterns of the reflection layer to the base substrate.

Optionally, the display substrate is a bottom emission type display substrate; the reflection layer is between the base substrate and the plurality of light emitting units; or, the reflection layer is on one side of the base substrate distal to the plurality of light emitting units.

Optionally, the display substrate is a top emission type display substrate, and the reflection layer is on one side of the plurality of light emitting units distal to the base substrate.

Optionally, a metal layer in the display substrate is reused as the reflection layer.

Optionally, the display substrate includes a thin film transistor; the metal layer is one or two of a gate layer and source-drain electrodes of the thin film transistor.

Optionally, the reflection layer is made of one or more of aluminum, titanium and molybdenum.

Optionally, orthographic projections of the plurality of openings to the base substrate coincide with orthographic projections of the plurality of pixel display areas to the base substrate.

Optionally, orthographic projections of the plurality of openings to the base substrate at least partially overlap orthographic projections of the plurality of pixel display areas to the base substrate.

One embodiment of the present disclosure further provides a display device, including a display substrate. The display substrate includes: a base substrate; a plurality of light emitting units on the base substrate, where the plurality of light emitting units include a plurality of pixel display areas; and a reflection layer on the base substrate. The reflection layer includes a plurality of patterns and a plurality of openings defined between adjacent patterns of the plurality of patterns, and positions of the plurality of openings are corresponding to positions of the plurality of pixel display areas.

Optionally, the display substrate further includes: a pixel definition layer on the base substrate; the pixel definition layer include a plurality of patterns; orthographic projections of the plurality of patterns of the pixel definition layer to the base substrate coincide with the orthographic projections of the plurality of patterns of the reflection layer to the base substrate.

Optionally, the display substrate includes a thin film transistor; one or two of a gate layer and source-drain electrodes of the thin film transistor is reused as the reflection layer.

One embodiment of the present disclosure further provides a method for manufacturing a display substrate, including: providing a base substrate; forming a plurality of light emitting units on the base substrate, wherein the plurality of light emitting units include a plurality of pixel display areas. The method further includes: forming a reflection layer in such a manner that the reflection layer includes a plurality of patterns and a plurality of openings defined between adjacent patterns of the plurality of patterns, and positions of the plurality of openings are corresponding to positions of the plurality of pixel display areas.

Optionally, the method further includes: forming a pixel definition layer via exposure with a first mask. The forming a reflection layer, includes: forming the reflection layer via exposure with the first mask.

Optionally, the base substrate has a first surface and a second surface opposite to the first surface, and the plurality of light emitting units are on the first surface of the base substrate, the display substrate is a bottom emission type display substrate. The forming a reflection layer, includes: forming the reflection layer on the first surface of the base substrate. The forming a plurality of light emitting units on the base substrate, includes: forming the plurality of light emitting units on one side of the reflection layer distal to the base substrate.

Optionally, the base substrate has a first surface and a second surface opposite to the first surface, and the plurality of light emitting units are on the first surface of the base substrate, the display substrate is a bottom emission type display substrate. The forming a reflection layer, includes: forming the reflection layer on the second surface of the base substrate.

Optionally, the display substrate is a top emission type display substrate. The forming a reflection layer, includes: forming the reflection layer on one side of the plurality of light emitting units distal to the base substrate.

BRIEF DESCRIPTION OF THE DRAWINGS

In order to explain the technical solutions of the embodiments of the present disclosure more clearly, the drawings used in the description of the embodiments of the present disclosure are briefly introduced below. Obviously, the drawings in the following description are just some embodiments of the present disclosure. For those of ordinary skill in the art, other drawings can be obtained based on these drawings without paying creative labor.

DETAILED DESCRIPTION

In order to make the objects, features and the advantages of the present disclosure more apparent, the present disclosure will be described hereinafter in a clear and complete manner in conjunction with the drawings and embodiments.

Figure 1:
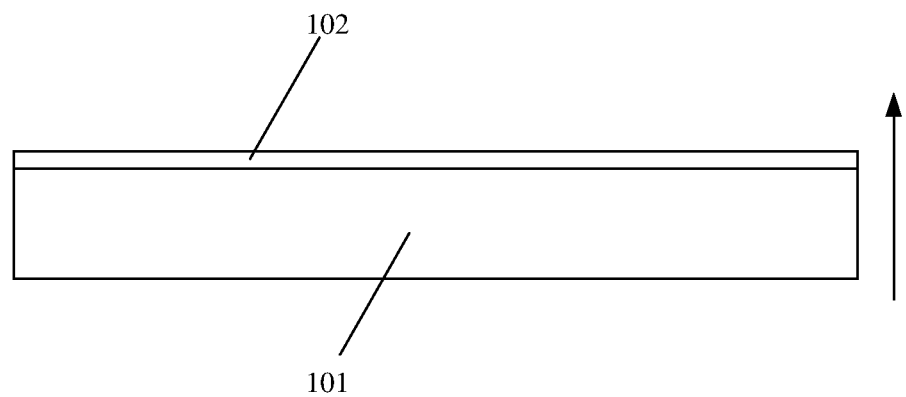
FIG. 1 is a schematic view of a mirror display device in the related art.

A mirror display device in the related art is usually realized by a transflective film. However, the transmittance of such display device is low. Meanwhile, due to the influence of external reflected light, the contrast of such display device is low when such display device realizes the display function. Thus, the display effect of the mirror display device in the related art is poor. For example, referring to FIG. 1, FIG. 1 is a schematic view of a mirror display device in the related art. As shown in FIG. 1, the mirror display device in the related art generally includes a display screen 101 and a transflective part 102 on the display screen 101. The transflective part 102 performs a reflection function in one direction and transmits light in other direction.

Specifically, light can pass through the transflective part 102 along a direction from the display screen 101 to the transflective part 102, i.e., an arrow direction shown in FIG. 1. In a direction opposite to the arrow direction, light cannot pass through the transflective part 102, and can only be reflected at the transflective part 102. In this way, the mirror display device can realize the display function, and can also realize the reflection function as a mirror. Such mirror display device is widely used in vehicle rearview mirrors, cosmetic mirrors and other scenes. However, transmittance of a display area of the mirror display device is low, and the contrast of the mirror display device is low due to the influence of external reflected light, thus, the display effect of the mirror display device in the related art is poor.

In view of this, embodiments of the present disclosure provide a display substrate, a method for manufacturing the same, and a display device, which can solve the problem that the display effect of the mirror display device in the related art is poor.

One embodiment of the present disclosure provides a display substrate. It should be noted that technical solutions of one embodiment of the present disclosure are mainly directed to a bottom emission type display substrate, and of course, may also be applied to a top emission type display substrate. In one embodiment, as shown in FIG. 2 to FIG. 4, the display substrate includes a base substrate 201, a plurality of light emitting units on the base substrate 201, and a reflection layer 202 on the base substrate 201.

The light emitting unit is on the base substrate 201, and includes a pixel display area 203. In some embodiments, a plurality of pixel regions is defined by gate lines and data lines that are crossed and insulated from each other on the base substrate 201. Each pixel region may be divided into a pixel display area and a non-display area. The pixel display area in each pixel region is a display area used for displaying, i.e., a light transmission area. Each light emitting unit may be one pixel region, and the pixel display area 203 of the light emitting unit may be the pixel display area in each pixel region. In addition, the pixel display area 203 of the light emitting unit may also be understood as an area through which emitted light can be transmitted to outside of the display substrate.

The reflection layer 202 is on the base substrate 201. When a user observes the display substrate, the reflection layer 202 is equivalent to a mirror surface and can implement a reflection function.

Figure 2:
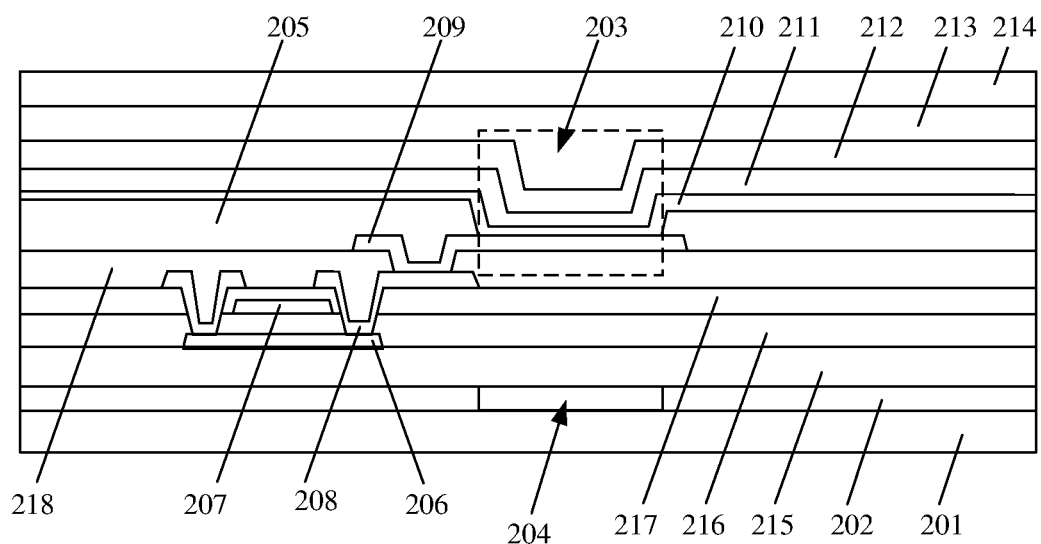
FIG. 2 is a schematic view of a display substrate according to an embodiment of the present disclosure.
Figure 3:
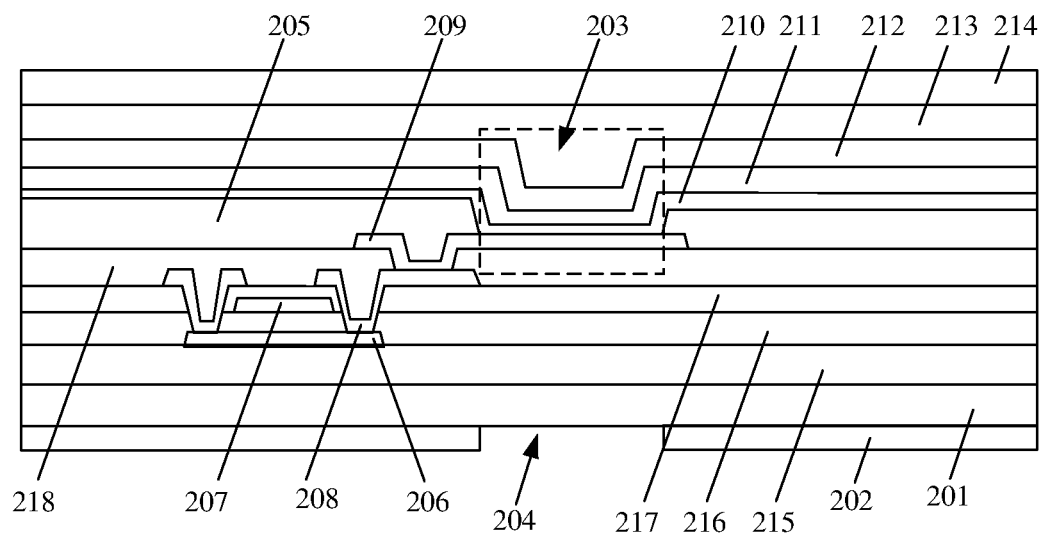
FIG. 3 is a schematic view of a display substrate according to another embodiment of the present disclosure.
Figure 4:
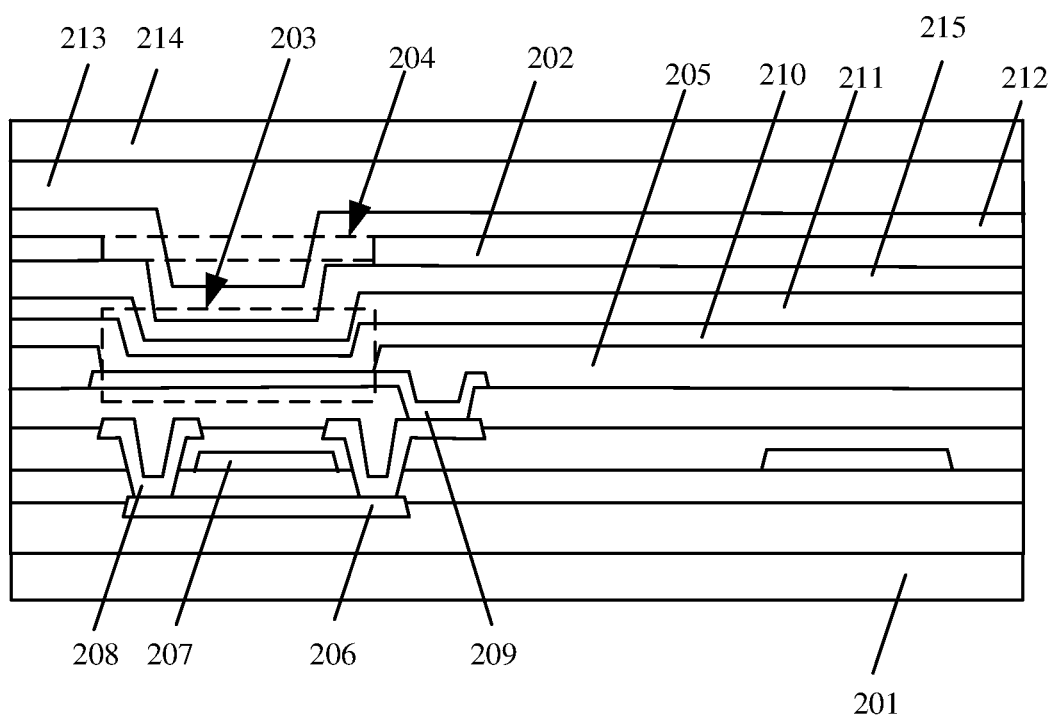
FIG. 4 is a schematic view of a display substrate according to another embodiment of the present disclosure.

Further, as shown in FIG. 2 to FIG. 4, the reflection layer 202 includes a plurality of patterns and a plurality of openings 204 defined between adjacent patterns. Positions of the openings 204 are corresponding to positions of the pixel display areas 203. In some embodiments, the positions of the openings 204 are vertically corresponding to the positions of the pixel display areas 203. In some embodiments, as shown in FIG. 2, the plurality of patterns included in the reflection layer 202 are in an identical layer. For example, all of the patterns included in the reflection layer 202 are on a surface of the base substrate 201. In some embodiments, there are gaps between orthographic projections of the patterns included in the reflection layer 202 to the base substrate 201, and these gaps define the openings 204.

In some embodiments, the positions of the openings 204 corresponding to the positions of the pixel display areas 203 means that an orthographic projection of the opening 204 to the display substrate at least partially overlaps an orthographic projection of the pixel display area 203 to the display substrate. In some embodiments, the orthographic projection of the opening 204 to the display substrate coincides with the orthographic projection of the pixel display area 203 to the display substrate. In this way, when displaying an image, light emitted from the pixel display area 203 can be transmitted to the outside of the display substrate through the opening 204, thereby achieving a display function.

Since the pixel display area 203 is corresponds to the opening 204 between the patterns of the reflection layer 202, the light is less blocked, which helps to ensure the display brightness and display effect.

In one embodiment of the present disclosure, the reflection layer 202 is provided, and the position of the opening 204 defined between the patterns of the reflection layer 202 is corresponding to the position of the pixel display area 203. In this way, light emitted from the pixel display area 203 of the light emitting unit can be emitted outside through the opening 204 of the reflection layer 202, thereby achieving normal display function while avoiding blocking and interference to the light emitted by the light emitting unit, which reduces light loss, helps to improve contrast and then improves display effect. Meanwhile, since the reflection layer 202 located at areas other than the pixel display area 203, such as the non-display area in the pixel region, can also realize reflection function, the display effect can be improved when the reflection function is realized.

Optionally, the display substrate further includes a pixel definition layer (PDL) 205 on the base substrate 201. Orthographic projections of patterns of the pixel definition layer 205 to the base substrate 201 coincide with the orthographic projections of the patterns of the reflection layer 202 to the base substrate 201.

Taking an organic light emitting diode (OLED) display substrate as an example, the pixel definition layer 205 defines a plurality of pixel regions. Each pixel region may be divided into a pixel display area and a non-display area. The pixel display area in each pixel region is a display area used for displaying, i.e., a light transmission area. Each light emitting unit may be one pixel region, and the pixel display area 203 of the light emitting unit may be the pixel display area in each pixel region.

When the orthographic projections of patterns of the pixel definition layer 205 to the base substrate 201 coincide with the orthographic projections of the patterns of the reflection layer 202 to the base substrate 201, on the one hand, it can prevent the pixel display area 203 from being blocked by the reflection layer 202 as much as possible; on the other hand, an area of the patterns of the reflection layer 202 can be maximized, which helps to improving the reflection effect and display effect. In addition, in the process of preparing the pixel definition layer 205 and the reflection layer 202, they may be prepared with an identical mask for photolithography, thereby saving costs.

The technical solutions of one embodiment of the present disclosure are mainly directed to a bottom emission type display substrate. As shown in FIG. 2 or FIG. 3, the display substrate includes a base substrate 201, thin film transistors, light emitting units and a packaging structure.

More specifically, the thin film transistor mainly includes an active layer 206, a gate layer 207, and source-drain electrodes 208. The light emitting unit mainly includes a first electrode layer 209, a light emitting layer 210, and a second electrode layer 211. The packaging structure mainly includes a first packaging layer 212, a second packaging layer 213, and a third packaging layer 214 that are stacked. In addition, the display substrate may further include a buffer layer 215, a gate insulation layer (GI) 216, an inter-layer dielectric (ILD) 217, a planarization layer (PLN) 218, a pixel definition layer (PDL) 205, or other structures and film layers.

As the bottom emission type display substrate, the base substrate 201 is made of transparent material, such as polyimide (PI), and glass. The first electrode layer 209 is close to a light emitting side of the display substrate. The first electrode layer 209 is a transparent electrode layer. The first electrode layer 209 may be made of indium tin oxide (ITO). The second electrode layer 211 is usually a metal electrode. The second electrode layer 211 may be made of aluminum, magnesium, silver, or indium tin oxide. The active layer 206 may be made of polysilicon (p-Si) or amorphous silicon (a-Si) according to the type of the display substrate. The first packaging layer 212 may be made of SiON, and thus has a good insulation effect and an isolation effect against water and oxygen. The second packaging layer 213 is an inkjet printing layer (IJP). The third packaging layer 214 may be made of SiNx.

The reflection layer 202 may be made of one or more of metal materials such as aluminum, titanium and molybdenum, and thus has a good reflection effect.

In implementation, the structures and materials of the display substrate may be further adjusted with reference to related technologies, which is not further limited and described herein.

One side of the base substrate 201 is the light emitting side of the display substrate. As shown in FIG. 2, the reflection layer 202 may be disposed between the base substrate 201 and the light emitting unit. Specifically, the reflection layer 202 may be first formed on the base substrate 201, and then structures such as thin film transistors and light emitting units are further formed on the reflection layer 202.

As shown in FIG. 3, the reflection layer 202 may also be disposed on one side of the base substrate 201 distal to the light emitting unit. Specifically, for example, the reflection layer 202 may be firstly formed on one surface of the base substrate 201, then the base substrate 201 is turned over, and then thin-film transistors, light emitting units and packaging layers and other structures are formed on the other surface of the base substrate 201. Alternatively, after thin-film transistors, light emitting units and packaging layers and other structures are formed on the base substrate 201, the display substrate is turned over, and then the reflection layer 202 is formed on the base substrate 201.

In addition, the technical solutions of one embodiment of the present disclosure may also be applied to a top emission type display substrate. As shown in FIG. 4, in another specific implementation, the display substrate is a top emission type display substrate. The display substrate mainly includes a base substrate 201, thin film transistors, light emitting units and a packaging structure.

The thin film transistor mainly includes an active layer 206, a gate layer 207, and source-drain electrodes 208. The light emitting unit mainly includes a first electrode layer 209, a light emitting layer 210, and a second electrode layer 211. The packaging structure mainly includes a first packaging layer 212, a second packaging layer 213 and a third packaging layer 214 that are stacked. In addition, the display substrate may further include a buffer layer 215, a gate insulation layer (GI) 216, an inter-layer dielectric (ILD) 217, a planarization layer (PLN) 218, a pixel definition layer (PDL) 205, or other structures and film layers. Materials and specific structures may refer to the foregoing embodiments or related technologies, which are not further limited and described herein.

It should be understood that, unlike a bottom emission type display substrate, when the display substrate is a top emission type display substrate, the second electrode layer 211 is disposed at a light emitting side of the display substrate, and thus the second electrode layer 211 is a transparent electrode and the first electrode layer 209 is usually a metal electrode.

The reflection layer 202 is located at one side of the light emitting unit distal to the base substrate 201. Specifically, the reflection layer 202 may be disposed between the light emitting unit and the packaging layer, thereby achieving a good mirror reflection effect.

Further, in order to protect the light emitting unit, a protective layer 219 may further be provided between the light emitting unit and the reflection layer 202. The protective layer 219 is disposed between the reflection layer 202 and the second electrode layer, and mainly serves to insulate and protect the second layer. The protective layer 219 may be made of SiNx, which is not limited herein.

It should be understood that, in the foregoing specific embodiments, the position of the reflection layer 202 is not fixed. For example, the buffer layer 215 may be a multi-layer composite structure, and the reflection layer 202 may also be fabricated in the multi-layer buffer layer. Similarly, the base substrate 201 may be a multi-layer composite polyimide layer, and then the reflection layer 202 may be formed in the polyimide layer.

Further, in an optional specific implementation, one metal layer in the display substrate may be reused as the reflection layer 202, thereby simplifying the process and saving costs.

Specifically, in implementation, one metal layer in the display substrate may be selected as the reflection layer 202, and positions of wires in the metal layer may be adjusted to avoid the pixel display area 203. Meanwhile, the metal layer is made to have a good reflection effect, so as to realize the function of the reflection layer 202. In this way, the reflection function can be realized without additional production for the reflection layer 202.

Specifically, the selected metal layer may be one or two of the gate layer 207 and the source-drain electrodes 208. In other words, the reflection function may be realized through the gate layer 207 alone or the source-drain electrodes 208 alone, or may be realized by both of the gate layer 207 and the source-drain electrodes 208.

Specifically, a bottom-emission type display substrate is taken as an example for description. In implementation, firstly, wiring of the gate layer 207 and the source-drain electrodes 208 may be designed. On the one hand, the wiring should avoid the pixel display area 203; on the other hand, the wiring should cover the area outside the pixel display area 203 as large as possible. Further, in the bottom emission type display substrate, one side close to the base substrate 201 is the light emitting side of the display substrate, thus, it is necessary to make sides of the gate layer 207 and the source-drain electrodes 208 close to the base substrate 201 have a good reflection effect, thereby realizing light emission function.

In addition, it should be understood that the position of the reflection layer 202 can be adjusted as long as the reflection layer 202 can reflect light.

The closer the reflection layer 202 is to the light emitting side of the display substrate, the less interference the light receives during the reflection process, and the better the mirror reflection effect it achieves.

One embodiment of the present disclosure further provides a display device including any one of the above display substrates. Since the display device of this embodiment includes all the technical solutions of the foregoing display substrate embodiment, at least all the technical effects described above can be achieved, and details are not described herein again.

One embodiment of the present disclosure further provides a method for manufacturing a display substrate.

Figure 5:
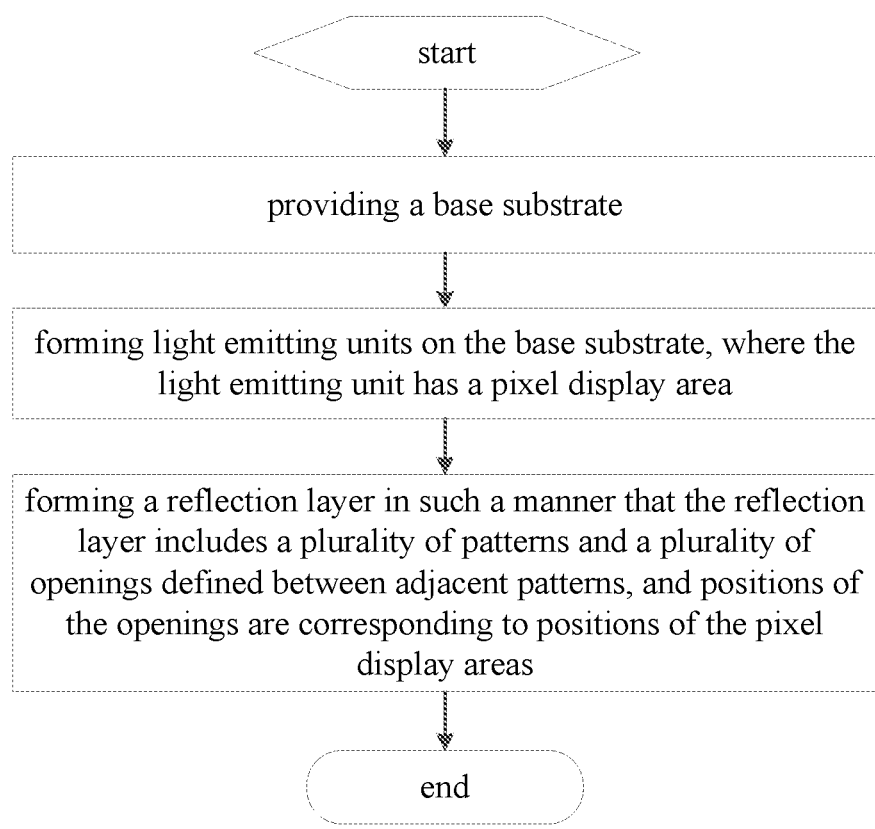
FIG. 5 is a flowchart of a method for manufacturing a display substrate according to an embodiment of the present disclosure.

As shown in FIG. 5, in one embodiment, a method for manufacturing the display substrate includes the following steps:

Step 501: providing a base substrate;

Step 502: forming light emitting units on the base substrate, where the light emitting unit has a pixel display area.

The method further includes:

Step 503: forming a reflection layer in such a manner that the reflection layer includes a plurality of patterns and a plurality of openings defined between adjacent patterns, and positions of the openings are corresponding to positions of the pixel display areas.

In one embodiment, the manufacturing process of the display substrate and the light emitting unit may refer to related technologies, which will not be elaborated herein.

The reflection layer made of metal material is taken as an example for description. In implementation, metal material is deposited at a specified position to form a metal layer. Then, photoresist is coated on the metal layer, and then the photoresist is exposed with a mask. Finally, the metal layer is etched to form patterns of the reflection layer 202. The manufacturing process of the reflection layer 202 may refer to related technologies, which will not be elaborated herein.

In one embodiment of the present disclosure, the reflection layer is provided, and the position of the opening defined between the patterns of the reflection layer is corresponding to the position of the pixel display area. In this way, light emitted from the pixel display area of the light emitting unit can be emitted outside through the opening of the reflection layer, thereby achieving normal display function while avoiding blocking and interference to the light emitted by the light emitting unit, which reduces light loss, helps to improve contrast and then improves display effect. Meanwhile, since the reflection layer located at areas other than the pixel display area, such as the non-display area in the pixel region, can also realize reflection function, the display effect can be improved when the reflection function is realized.

Further, the display substrate further includes a pixel definition layer. the manufacturing process of the pixel definition layer specifically includes steps such as exposure, development and etching.

In this process, the exposure process specifically includes: forming the pixel definition layer via exposure with a first mask.

Further, the above step 502 includes: forming the reflection layer via exposure with the first mask.

It can be understood that the pixel definition layer and the reflection layer may be formed via the same mask. As can be seen from the above analysis, when the patterns of the pixel definition layer and patterns of the reflection layer are the same, it can prevent the pixel display area from being blocked by the reflection layer, thereby improving the reflection effect and display effect.

By using the same mask for exposing during the process of making the pixel definition layer and the reflection layer, the patterns of the pixel definition layer and the patterns of the reflection layer can be considered to be the same under the condition of ignoring possible errors. Orthographic projections of patterns of the pixel definition layer to the base substrate coincide with orthographic projections of the patterns of the reflection layer to the base substrate. In this way, the reflection effect and display effect can be improved. Meanwhile, no additional design and production of masks are required, thereby saving costs.

It should be understood that the above step 503 may be performed before the step 502, or may be performed after the step 502.

For example, in a specific implementation, the display substrate is a bottom emission type display substrate, the base substrate has a first surface and a second surface opposite to the first surface, and the light emitting units are on the first surface of the base substrate. The forming a reflection layer includes: forming the reflection layer on the first surface of the base substrate.

The forming light emitting units on the base substrate, includes: forming the light emitting units on one side of the reflection layer distal to the base substrate.

In this specific implementation, the step 503 is performed before the step 502, that is, the reflection layer is first formed on the base substrate, and then thin film transistors, light emitting units and the packaging structure are formed on the reflection layer.

In another specific implementation, the base substrate has a first surface and a second surface opposite to the first surface, and the light emitting units are on the first surface of the base substrate. The display substrate is a bottom-emission type display substrate. The forming a reflection layer includes: forming the reflection layer on the second surface of the base substrate.

In this specific implementation, the step 503 may be performed before the step 502, or may be performed after the step 502. For example, the reflection layer may be firstly formed on one surface of the base substrate, then the base substrate is turned over, and then thin-film transistors, light emitting units and packaging layers and other structures are formed on the other surface of the base substrate. Alternatively, after thin-film transistors, light emitting units and packaging layers and other structures are formed on the base substrate, the display substrate is turned over, and then the reflection layer is formed on the base substrate.

In the above two specific implementations, if the reflection layer is first formed, it is not necessary to consider possible impact of the manufacturing process of the reflection layer on other structures. Thus, the reflection layer may be formed by the conventional manufacturing process at a higher temperature, and the formed film layer is dense. Meanwhile, the formed film layer is flatter and has better reflection effect.

In another specific implementation, the display substrate is a top emission type display substrate, and the step 503 includes: forming the reflection layer on one side of the light emitting units distal to the base substrate.

In this specific implementation, the step 503 is performed after the step 502, that is, the light emitting units are formed first, and then the reflection layer is formed.

It should be understood that if the step 503 is performed after the step 502, a low-temperature deposition process is employed to form the reflection layer, thereby preventing high temperature from affecting other structures, such as light emitting units.

It should be understood that, in case that the display substrate is a top emission type display substrate, before the reflection layer is formed, the method may further include a step of forming a protective layer in the foregoing embodiment of the display substrate. Specific manufacturing process of the protective layer may refer to related technologies, which will not be elaborated herein.

The above is only the specific embodiments of the present disclosure, but the protection scope of the present disclosure is not limited thereto. It should be pointed out that, for persons having ordinary skill in the art, several improvements and changes may be made, without departing from the principle of the present disclosure. These improvements and changes should also be within the scope of the present disclosure.

The invention claimed is:

1. A display substrate, wherein the display substrate is a bottom emission type display substrate, and the display substrate comprises:
   a base substrate;
   a plurality of light emitting units on the base substrate; wherein the plurality of light emitting units include a plurality of pixel display areas; and
   a reflection layer on the base substrate;
   wherein the reflection layer includes a plurality of patterns and a plurality of openings defined between adjacent patterns of the plurality of patterns, and positions of the plurality of openings are corresponding to positions of the plurality of pixel display areas; and
   wherein the reflection layer is directly disposed on a surface of the base substrate on a side away from the plurality of light emitting units.

2. The display substrate according to claim 1, wherein the display substrate further includes: a pixel definition layer on the base substrate; the pixel definition layer include a plurality of patterns; orthographic projections of the plurality of patterns of the pixel definition layer to the base substrate coincide with the orthographic projections of the plurality of patterns of the reflection layer to the base substrate.

3. The display substrate according to claim 1, wherein the display substrate includes a thin film transistor, and the thin film transistor includes a source-drain metal layer and a gate metal layer.

4. The display substrate according to claim 1, wherein the reflection layer is made of one or more of aluminum, titanium and molybdenum.

5. The display substrate according to claim 1, wherein orthographic projections of the plurality of openings to the base substrate coincide with orthographic projections of the plurality of pixel display areas to the base substrate.

6. The display substrate according to claim 1, wherein orthographic projections of the plurality of openings to the base substrate at least partially overlap orthographic projections of the plurality of pixel display areas to the base substrate.

7. A display device, comprising a display substrate;
   wherein the display substrate is a bottom emission type display substrate, and the display substrate comprises:
   a base substrate;
   a plurality of light emitting units on the base substrate; wherein the plurality of light emitting units include a plurality of pixel display areas; and
   a reflection layer on the base substrate;
   wherein the reflection layer includes a plurality of patterns and a plurality of openings defined between adjacent patterns of the plurality of patterns, and positions of the plurality of openings are corresponding to positions of the plurality of pixel display areas; and
   wherein the reflection layer is directly disposed on a surface of the base substrate on a side away from the plurality of light emitting units.

8. The display device according to claim 7, wherein the display substrate further includes: a pixel definition layer on the base substrate; the pixel definition layer include a plurality of patterns; orthographic projections of the plurality of patterns of the pixel definition layer to the base substrate coincide with the orthographic projections of the plurality of patterns of the reflection layer to the base substrate.

9. The display device according to claim 8, wherein the display substrate includes a thin film transistor.

10. A method for manufacturing a display substrate, comprising:
    providing a base substrate;
    forming a plurality of light emitting units on the base substrate, wherein the plurality of light emitting units include a plurality of pixel display areas;
    the method further includes:
      forming a reflection layer in such a manner that the reflection layer includes a plurality of patterns and a plurality of openings defined between adjacent patterns of the plurality of patterns, and positions of the plurality of openings are corresponding to positions of the plurality of pixel display areas;
    wherein the method further includes: forming a pixel definition layer via exposure with a first mask;

wherein the forming a reflection layer, includes: forming the reflection layer via exposure with the same first mask.

11. The method according to claim 10, wherein the base substrate has a first surface and a second surface opposite to the first surface, and the plurality of light emitting units are on the first surface of the base substrate, the display substrate is a bottom emission type display substrate;
   wherein the forming a reflection layer, includes: forming the reflection layer on the first surface of the base substrate;
   wherein the forming a plurality of light emitting units on the base substrate, includes: forming the plurality of light emitting units on one side of the reflection layer distal to the base substrate.

12. The method according to claim 10, wherein the base substrate has a first surface and a second surface opposite to the first surface, and the plurality of light emitting units are on the first surface of the base substrate, the display substrate is a bottom emission type display substrate;
   wherein the forming a reflection layer, includes: forming the reflection layer on the second surface of the base substrate.

13. The method according to claim 10, wherein the display substrate is a top emission type display substrate;
   wherein the forming a reflection layer, includes: forming the reflection layer on one side of the plurality of light emitting units distal to the base substrate.

* * * * *